United States Patent
Sotta

(10) Patent No.: US 11,876,073 B2
(45) Date of Patent: Jan. 16, 2024

(54) PROCESS FOR COLLECTIVELY FABRICATING A PLURALITY OF SEMICONDUCTOR STRUCTURES

(71) Applicant: Soitec, Bernin (FR)

(72) Inventor: David Sotta, Grenoble (FR)

(73) Assignee: SOITEC, Bernin (FR)

( * ) Notice: Subject to any disclaimer, the term of this patent is extended or adjusted under 35 U.S.C. 154(b) by 169 days.

(21) Appl. No.: 17/291,957

(22) PCT Filed: Oct. 24, 2019

(86) PCT No.: PCT/FR2019/052538
§ 371 (c)(1),
(2) Date: May 6, 2021

(87) PCT Pub. No.: WO2020/094944
PCT Pub. Date: May 14, 2020

(65) Prior Publication Data
US 2022/0005785 A1  Jan. 6, 2022

(30) Foreign Application Priority Data

Nov. 8, 2018 (FR) ...................................... 1860294

(51) Int. Cl.
*H01L 21/02* (2006.01)
*H01L 23/00* (2006.01)
(Continued)

(52) U.S. Cl.
CPC ........ *H01L 24/94* (2013.01); *H01L 21/02639* (2013.01); *H01L 21/2007* (2013.01);
(Continued)

(58) Field of Classification Search
None
See application file for complete search history.

(56) References Cited

U.S. PATENT DOCUMENTS 6,521,510 B1    2/2003  Fisher et al.
8,058,161 B2 *  11/2011 Barna ............. H01L 21/823437
                                                  257/E21.429
(Continued)

FOREIGN PATENT DOCUMENTS

CN    105917444 A    8/2016
CN    106486482 A    3/2017
(Continued)

OTHER PUBLICATIONS

Chiu et al., Fabrication of InGaN/GaN Nanorod Light-Emitting Diodes with Self-Assembled Ni-Metal Islands, Nanotechnology vol. 18, (2007), 5 pages.
(Continued)

*Primary Examiner* — Bradley Smith
(74) *Attorney, Agent, or Firm* — TraskBritt

(57) ABSTRACT

A process for collectively fabricating a plurality of semiconductor structures comprises providing a substrate including a carrier having a main face, a dielectric layer on the main face of the carrier and a plurality of crystalline semiconductor growth islands on the dielectric layer. At least one crystalline semiconductor active layer is formed on the growth islands. After the step of forming the active layer, trenches are formed in the active layer and in the growth islands in order to define the plurality of semiconductor structures.

18 Claims, 2 Drawing Sheets

(51) Int. Cl.
    *H01L 33/00*     (2010.01)
    *H01L 21/20*     (2006.01)
    *H01L 25/065*     (2023.01)
    *H01L 25/00*     (2006.01)

(52) U.S. Cl.
    CPC .......... *H01L 25/0655* (2013.01); *H01L 25/50* (2013.01); *H01L 33/0093* (2020.05); *H01L 2224/94* (2013.01)

(56) References Cited

U.S. PATENT DOCUMENTS

| | | | |
|---|---|---|---|
| 8,058,656 B2* | 11/2011 | Marion | H01L 25/50 438/129 |
| 2012/0119218 A1 | 5/2012 | Su | |
| 2018/0269253 A1 | 9/2018 | Sotta et al. | |
| 2019/0228967 A1* | 7/2019 | Sotta | H01L 21/02532 |

FOREIGN PATENT DOCUMENTS

| | | |
|---|---|---|
| CN | 106684037 A | 5/2017 |
| EP | 2151856 A1 | 2/2010 |
| EP | 2151852 B1 | 1/2020 |
| FR | 2992465 B1 | 3/2015 |
| FR | 3056825 B1 | 4/2019 |
| JP | 01-185935 A | 7/1989 |
| JP | 2001-044276 A | 2/2001 |
| WO | 2018/060570 A1 | 4/2018 |

OTHER PUBLICATIONS

International Search Report for International Application No. PCT/FR2019/052538 filed Jan. 8, 2020, 2 pages.
International Written Opinion for International Application No. PCT/FR2019/052538 filed Jan. 8, 2020, 5 pages.
Chinese Office Action and Search Report for Application No. 201980068128.2 dated Nov. 30, 2023, 14 pages with machine translation.

* cited by examiner

[Fig. 1a]
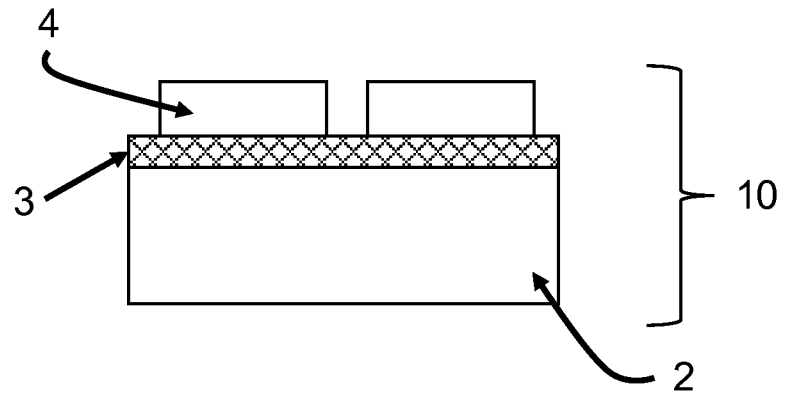
[Fig. 1b]
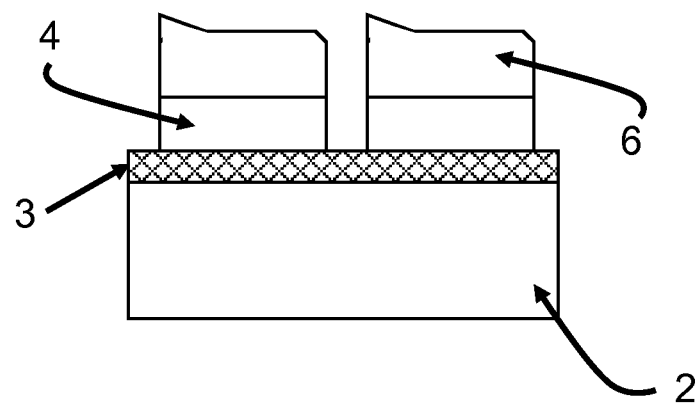
[Fig. 1c]
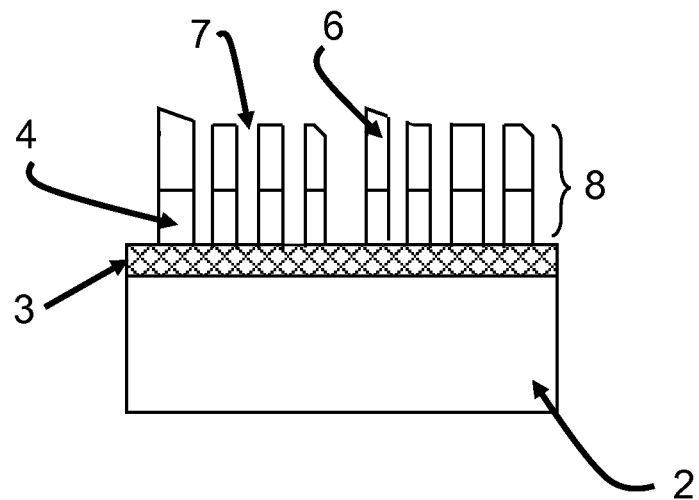

[Fig. 2a]
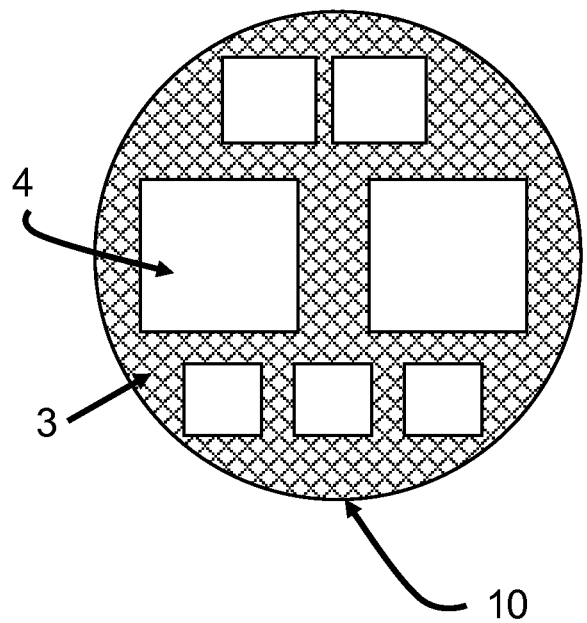
[Fig. 2b]
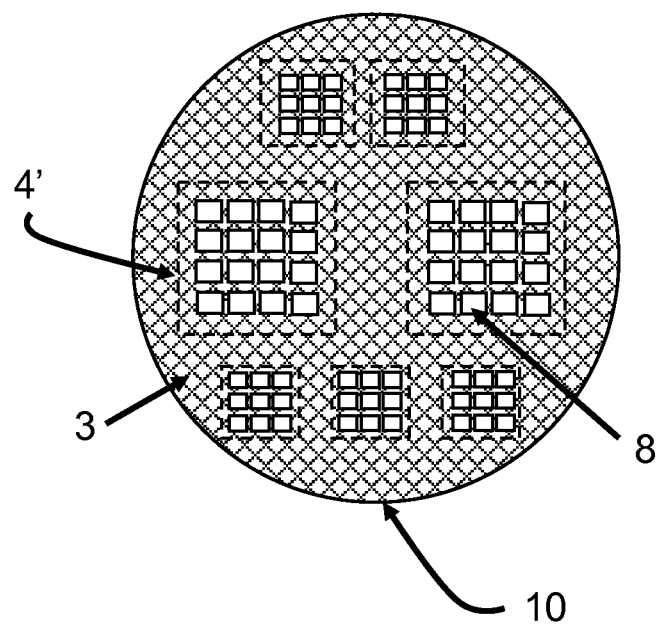

PROCESS FOR COLLECTIVELY FABRICATING A PLURALITY OF SEMICONDUCTOR STRUCTURES

CROSS-REFERENCE TO RELATED APPLICATIONS

This application is a national phase entry under 35 U.S.C. § 371 of International Patent Application PCT/FR2019/052538, filed Oct. 24, 2019, designating the United States of America and published as International Patent Publication WO 2020/094944 A1 on May 14, 2020, which claims the benefit under Article 8 of the Patent Cooperation Treaty to French Patent Application Serial No. 1860294, filed Nov. 8, 2018.

TECHNICAL FIELD

The present disclosure relates to a process for collectively fabricating a plurality of semiconductor structures.

BACKGROUND

A process for collectively fabricating a plurality of semiconductor structures is, for example, known from document FR2992465. In this document, a substrate formed from a carrier, from a dielectric layer placed on the main face of the carrier, and from a plurality of at least partially relaxed growth islands made of InGaN is provided. Next, a stack of semiconductor layers is formed on the growth islands in order to produce a light-emitting diode (LED). This stack comprises an n-type contact layer, active layers, and a p-type contact layer. In the cited document, the islands are of square shape and have a side length of 1 mm size.

Relaxation of the growth islands formed from a crystalline semiconductor material may be obtained during a preliminary process for fabricating the substrate, such as, for example, is described in documents EP2151852 and EP2151856. It is thus possible to achieve growth islands having a seed surface, able to receive a stack of layers forming the semiconductor structure, and the lattice parameter of which may be chosen. This chosen lattice parameter cannot always be provided by a surface of a bulk semiconductor available at a reasonable cost. For this reason, the preliminary process for fabricating the substrate is particularly advantageous.

In document WO2018060570, it is observed that a layer made of crystalline semiconductor and, in particular, a layer of InGaN, formed on an "island-comprising" substrate such as that described in the aforementioned French document, may have a non-uniform thickness. Specifically, the thickness of the layer on the edges of the island may be very different from the relatively constant thickness of the layer closer to the center of the island. This thickness difference may extend over a distance of about 1 µm from the peripheral edge of the growth island.

It is, therefore, difficult to form layers of very controlled thickness when the island has a small size, for example, when the island is inscribed in a circle, the diameter of which is comprised between 0.1 and 5 µm. Furthermore, the semiconductor structures that it is aimed to form on these growth islands of small dimensions do not always work.

Collective production, with a good yield, of a plurality of semiconductor structures of small dimensions, therefore, poses a problem that the present disclosure aims to solve.

BRIEF SUMMARY

With a view toward achieving this aim, the subject matter of the disclosure relates to a process for collectively fabricating a plurality of semiconductor structures, the process comprising:
  providing a substrate formed from a carrier having a main face, from a dielectric layer placed on the main face of the carrier and from a plurality of crystalline semiconductor growth islands placed on the dielectric layer; and
  forming a crystalline semiconductor active layer on the growth islands.

According to the disclosure, the process comprises, after the step of forming the active layer, forming trenches in the active layer and the growth islands in order to define the plurality of semiconductor structures.

By forming the active layer on growth islands of relatively large dimensions and by defining the semiconductor structures (which are of relatively small dimensions) after the active layer has been formed, the effects of non-uniformity at the edges of the growth islands is limited to a limited number of semiconductor structures, this allowing the structures to be obtained with a high fabrication yield.

According to other advantageous and non-limiting features of the disclosure, which may be implemented alone or in any technically feasible combination:
  the growth islands are placed directly on, and in contact with, the dielectric layer;
  the active layer is a III-V material;
  the growth islands are made of InGaN;
  the formation of the trenches is such as to expose the dielectric layer;
  the trenches have a width comprised between 0.1 and 5 µm;
  the semiconductor structures have a principal dimension comprised between 0.1 and 3 µm;
  the growth islands have a principal dimension comprised between 5 microns and 2 millimeters;
  the growth islands are separated from one another by a distance larger than or equal to 5 microns; and/or
  the process comprises removing a peripheral segment of at least one crystalline semiconductor growth island and of the active layer placed on the island.

BRIEF DESCRIPTION OF THE DRAWINGS

Other features and advantages of the disclosure will become apparent from the following detailed description, which description is given with reference to the accompanying figures, in which:
  FIGS. 1a to 1c show schematic cross-sectional views of a substrate during the main steps of a fabricating process according to the present disclosure;
  FIG. 2a shows a schematic top view of an "island-comprising" substrate; and
  FIG. 2b shows a schematic top view of a substrate at the end of a process according to the disclosure.

DETAILED DESCRIPTION

The present disclosure aims to collectively fabricate a plurality of semiconductor structures of small dimensions. In the present disclosure, what is meant by the term "semiconductor structure" is any semiconductor device able to be controlled or exploited individually and comprising a stack of semiconductor layers defining an active layer, i.e., a layer having optoelectronic properties. It may, for example, be a question of a light-emitting diode, of a laser diode, of a photovoltaic cell or of any other optoelectronic device. Apart from the stack of the semiconductor layers forming the active layer, the functional device may comprise other elements such as a carrier, contact pads, or conductive vias or micro-lenses, making it possible to make it actually functional.

It is not necessary for each semiconductor structure, at the end or during the collective fabricating process, to be individualized from the other structures to fabricate a completely independent device. A set of structures may be kept joined to one another in order to be placed in a single package, while preserving the individually controllable or exploitable character of each structure. For example, the process may aim to fabricate monolithic panels of micro-LEDs, each micro-LED of a panel being able to be controlled individually.

FIGS. 1a to 1c show the main steps of a process according to the present disclosure. The process comprises an initial step of providing an "island-comprising" substrate 10.

As may be seen in the schematic top view of FIG. 2a, the substrate 10 may take the form of a circular wafer of standardized size, for example, of 2 inches (50 mm), 4 inches (100 mm), or even 200 mm diameter. However, the disclosure is in no way limited to these dimensions or to this shape.

The substrate 10 comprises a carrier 2 made of silicon or sapphire, for example. The carrier 2 has a main face. A dielectric layer 3 is placed on the main surface of the carrier 2. The dielectric layer 3 may be made of silicon dioxide, silicon nitride, or of a stack of one or more layers, for example, made of these materials. The dielectric layer 3 may have a thickness of between 10 nm and several microns.

The substrate 10 also comprises, on the dielectric layer 3, a plurality of crystalline semiconductor growth islands 4 (more simply designated "growth islands" in the rest of the description). By "a plurality of islands," what is meant is a film formed from a set of independent and non-contiguous zones, these zones possibly being bounded by trenches exposing the dielectric layer 3, as may be seen in FIG. 1a. The islands may all have sizes and/or shapes that are identical to or different from one another.

For reasons of simplicity of implementation, the growth islands 4 are placed directly on, and in contact with, the dielectric layer.

The disclosure is in no way limited to growth islands 4 of a particular nature, but the structure 10 has a particularly advantageous application when these islands are made of a III-V material, in particular, InGaN, that is relaxed or partially relaxed. The InGaN material may contain a proportion of indium of between 1% and 20%. Each island may have a thickness of between 100 nm and 200 nm, and have a principal dimension in the plane defined by the carrier 2 (diameter or length depending on the shape of the island) of between a few microns, for example, 5 microns, and a few mm, for example, 2 mm. The growth islands 4 may be separated from one another by a distance larger than or equal to 5 microns.

It is thus possible to form a substrate 10 presenting growth islands 4, the exposed surfaces of which have a lattice parameter of between 0.3189 nm and 0.3220 nm, able to receive at least one active layer made of III-V material in order to form a semiconductor device such as a light-emitting diode. Processes for fabricating such an "island-comprising" substrate are, for example, described in documents EP2151852 and EP2151856.

It could also be chosen to form, depending on the nature of the semiconductor substrate that is fabricated, the plurality of islands from AlGaN or from any other material, such as a III-V material and, more particularly, from a III-N material.

As is shown in FIG. 1b, the process for collectively fabricating a plurality of semiconductor structures, then comprises a step aiming to form at least one crystalline semiconductor active layer 6, referred to below in this description as the "active layer," on the growth islands 4.

To this end, the substrate 10 may be placed in a chamber of a conventional piece of growth equipment. As is well known per se, the chamber, which is raised in temperature, is passed through by flows of precursor gases, transporting the species from which the active layer is made. The species comprised in the precursor gases flowing through the chamber, react with the exposed surfaces of the substrate 10. On the exposed surfaces of the growth islands 4, a crystalline semiconductor active layer 6 gradually forms by epitaxy.

The growth equipment may be controlled in order to form a plurality of crystalline semiconductor layers, in order to form the stack defining the optoelectronic active layer. Thus, and by way of example, when the collectively fabricating process aims to produce LEDs, it is possible to form, on partially relaxed growth islands of InGaN, the lattice parameter of which may be larger than 0.3205 nm, a stack made up of an n-type contact layer having a lattice-parameter mismatch with the donor layer smaller than 1% and the thickness of which may be comprised between 100 nm and 2 microns, of an alternation of quantum wells and barrier layers in order to provide an emission wavelength longer than 530 nm and of a p-type contact layer having a lattice-parameter mismatch with the InGaN island smaller than 1% and a thickness comprised between 10 nm and 1 micron.

At the end of this step, and whatever the number and nature of the crystalline semiconductor layers that have been deposited, an active layer 6, the thickness of which is non-uniform, is obtained on the surface of each growth island 4. The thickness of the material of this crystalline semiconductor active layer 6 is, on the peripheral perimeter of the growth islands 4, greater or smaller. This peripheral variation in thickness may extend over a distance of one or more microns from the edge of the growth islands 4.

In a following step, shown in FIGS. 1c and 2b, trenches 7 are formed in the active layer 6 and in the growth islands 4 in order to define a plurality of semiconductor structures 8. The trenches pass right through the active layer 6. It is not necessary for the growth islands 4 to be passed right through by the trenches 7, though it is advantageous to employ the dielectric layer 3 as a stop layer during the formation of these trenches.

The trenches 7 may be formed very simply using photolithography and wet or dry etching techniques. These techniques, which are well known per se, aim to mask, using a resist, the zones to be preserved from an etchant to which the substrate 10 is exposed. This etchant reacts with the exposed surface of the active layer 6 and/or of the growth islands 4 in order to form the trenches 7.

At the end of this step, and as may be very clearly seen in FIG. 1c, most of the semiconductor structures 8 thus defined comprise an active layer 6, the thickness of which is very uniform.

The thickness of semiconductor structures 8 placed on the perimeter of the growth islands 4 may be non-uniform, or be a thickness that will possibly be different from that of the active layers formed closer to the center, in the interior of the peripheral perimeter of the growth islands 4. This feature may make these semiconductor structures 8 not work, but affects a small number of such structures.

In one advantageous implementation, the step of defining the semiconductor structures 8 is carried out in such a way as to remove the peripheral segment 4' of the growth islands 4 and the active layer 6, the thickness of which may be non-uniform placed on these islands. When the trenches 7 are produced by photolithography and etching, this implementation then consists in not masking this peripheral segment 4' with resist in order to expose it to the etchant. The definition of semiconductor structures that could be non-functional is thus avoided. The substrate obtained at the end of this implementation is shown in FIG. 2b, in which it may clearly be seen that the peripheral segment 4' of the growth island (bounded by the dashed line in this figure) has been removed.

The trenches 7 defining the semiconductor structures 8 are produced so as to be as small in width as possible and, for example, so that their width is between 0.1 microns and 5 microns.

The semiconductor structures 8 defined by the trenches 7 are of any shape and size, which may be dictated or chosen depending on the targeted application. It may thus be a question of square or rectangular shapes when the trenches 7 are rectilinear and cross one another perpendicularly. However, the disclosure is in no way limited to this example and any other shape, circular or octagonal, for example, may be appropriate. A person skilled in the art will be very easily able to define the shape and arrangement of the trenches 7 so that the semiconductor structures 8 have the chosen form.

The principal dimension of the semiconductor structures 8 (diameter or length) may be between 0.1 micron and 3 μm.

By forming the active layer on growth islands of relatively large dimensions and by defining the semiconductor structures (which are of relatively small dimensions) after the active layer has been formed, the effects of non-uniformity at the edges of the growth islands is limited to a limited number of semiconductor structures, this allowing the structures to be obtained with a high fabrication yield.

In the context of the present disclosure, the size and shape of the growth islands 4 of the substrate 10 are dictated solely by the process for fabricating this substrate and, in particular, by the relaxing steps of this process. The size and/or shape of the semiconductor structures 8 is for their/its part chosen to be a perfect match to the targeted application, by adjusting the shape and arrangement of the trenches.

In other words, the approach employed in the present disclosure allows the features of the growth islands 4 of the substrate 10 to be decoupled from the features of the semiconductor structures 8, which was not the case in known approaches. Surprisingly, this approach allows fabrication yields to be significantly improved.

It is, of course, advantageous to maximize the ratio between the size of a growth island 4 and the size of a semiconductor structure 8, and to minimize the area occupied by the trenches 7. Thus, it is possible to aim to form a very high number of semiconductor structures 8 in each growth island and on each carrier. Thus, several tens, or even several hundred semiconductor structures 8 will possibly be produced on each growth island 4.

Of course, the disclosure is not limited to the described embodiment and variants thereof may fall within the scope of the invention as defined by the claims.

A process according to the disclosure may, of course, comprise steps other than those described in detail in the present description, in order to make the semiconductor structure entirely functional. The process may thus comprise forming electrical contacts on constituent layers of the active layer 6 (the p- and n-type contact layers, to continue with the preceding example), removing the carrier 2 and transferring the semiconductor structures 8 to another substrate, and singulating and packaging each structure or a set of semiconductor structures 8.

The invention claimed is:

1. A method of collectively fabricating a plurality of semiconductor structures, comprising:
    providing a substrate including a carrier having a main face, a dielectric layer on the main face of the carrier and a plurality of crystalline semiconductor growth islands on the dielectric layer;
    forming a crystalline semiconductor active layer on the plurality of crystalline semiconductor growth islands; and
    after the step of forming the crystalline semiconductor active layer, forming trenches in the crystalline semiconductor active layer and the plurality of crystalline semiconductor growth islands in order to define the plurality of semiconductor structures.

2. The method of claim 1, wherein the crystalline semiconductor growth islands of the plurality are directly on, and in contact with, the dielectric layer.

3. The method of claim 2, wherein the crystalline semiconductor active layer comprises a III-V material.

4. The method of claim 3, wherein the crystalline semiconductor growth islands of the plurality comprise InGaN.

5. The method of claim 4, wherein forming the trenches comprises exposing the dielectric layer.

6. The method of claim 5, further comprising forming the trenches to have a width between 0.1 and 5 μm.

7. The method of claim 6, further comprising forming the semiconductor structures to have a principal dimension between 0.1 and 3 μm, wherein the principal dimension is in a plane parallel to the main face of the carrier.

8. The method of claim 7, further comprising forming the crystalline semiconductor growth islands of the plurality to have a principal dimension between 5 microns and 2 millimeters, wherein the principal dimension is in a plane parallel to the main face of the carrier.

9. The method of claim 8, wherein the crystalline semiconductor growth islands of the plurality are separated from one another by a distance larger than or equal to 5 microns.

10. The method of claim 9, further comprising removing a peripheral segment of at least one growth island of the plurality of crystalline semiconductor growth islands and the crystalline semiconductor active layer placed on the at least one growth island of the plurality of crystalline semiconductor growth islands.

11. The method of claim 1, wherein the crystalline semiconductor active layer comprises a III-V material.

12. The method of claim 1, wherein the crystalline semiconductor growth islands of the plurality comprise InGaN.

13. The method of claim 1, wherein forming the trenches comprises exposing the dielectric layer.

14. The method of claim 1, further comprising forming the trenches to have a width between 0.1 and 5 μm.

15. The method of claim 1, further comprising forming the semiconductor structures to have a principal dimension between 0.1 and 3 μm, wherein the principal dimension is in a plane parallel to the main face of the carrier.

16. The method of claim 1, further comprising forming the crystalline semiconductor growth islands of the plurality to have a principal dimension between 5 microns and 2 millimeters, wherein the principal dimension is in a plane parallel to the main face of the carrier.

17. The method of claim 1, wherein crystalline semiconductor growth islands of the plurality are separated from one another by a distance larger than or equal to 5 microns.

18. The method of claim 1, further comprising removing a peripheral segment of at least one growth island of the plurality of crystalline semiconductor growth islands and the crystalline semiconductor active layer placed on the at least one growth island of the plurality of crystalline semiconductor growth islands.

* * * * *